United States Patent
Paul et al.

(10) Patent No.: US 10,718,844 B2
(45) Date of Patent: Jul. 21, 2020

(54) REDUCING ARTIFACTS IN MAGNETIC RESONANCE TECHNOLOGY

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 267 days.

(21) Appl. No.: 15/647,538

(22) Filed: Jul. 12, 2017

(65) Prior Publication Data

US 2018/0017654 A1 Jan. 18, 2018

(30) Foreign Application Priority Data

Jul. 12, 2016 (DE) .................. 10 2016 212 632

(51) Int. Cl.
*G01R 33/565* (2006.01)
*G01R 33/36* (2006.01)
*G01R 33/385* (2006.01)

(52) U.S. Cl.
CPC ....... *G01R 33/56572* (2013.01); *G01R 33/36* (2013.01); *G01R 33/385* (2013.01)

(58) Field of Classification Search
None
See application file for complete search history.

(56) References Cited

U.S. PATENT DOCUMENTS

| 4,593,247 | A | 6/1986 | Glover |
| 4,709,211 | A | 11/1987 | Machida et al. |
| 5,245,283 | A | 9/1993 | Provost et al. |
| 7,109,711 | B2 | 9/2006 | Kiefer |
| 2002/0101237 | A1 | 8/2002 | Miyosi et al. |
| 2005/0017719 | A1 | 1/2005 | Heubes |
| 2012/0025826 | A1 | 2/2012 | Zhou et al. |
| 2014/0028313 | A1 | 1/2014 | Paul |
| 2014/0210471 | A1* | 7/2014 | Stemmer .......... G01R 33/56554 324/309 |
| 2014/0368195 | A1 | 12/2014 | Eggers et al. |
| 2015/0226823 | A1 | 8/2015 | Speier |
| 2016/0041249 | A1 | 2/2016 | Lee et al. |
| 2017/0356973 | A1* | 12/2017 | Wheaton .......... G01R 33/3854 |

FOREIGN PATENT DOCUMENTS

| CN | 103576114 A | 2/2014 |
| CN | 104067137 A | 9/2014 |
| CN | 104833931 A | 8/2015 |
| EP | 0526983 A1 | 2/1993 |

OTHER PUBLICATIONS

Chinese Office Action dated Jul. 18, 2019, for Application No. 201710560116.4, and English language translation.

* cited by examiner

*Primary Examiner* — Paresh Patel

(74) *Attorney, Agent, or Firm* — Schiff Hardin LLP

(57) ABSTRACT

In a method and magnetic resonance (MR) apparatus for avoiding artifacts in scan data recorded by execution of a spin-echo sequence, an excitation pulse is radiated, at least one refocusing pulse is radiated, and at least one echo signal is read out. Following the radiation of the excitation pulse and before the readout of the at least one echo signal, at least two artifact-avoidance gradients with different amplitudes are activated, wherein the moments of the artifact-avoidance gradients balance each other.

12 Claims, 4 Drawing Sheets

REDUCING ARTIFACTS IN MAGNETIC RESONANCE TECHNOLOGY

BACKGROUND OF THE INVENTION

Field of the Invention

The invention concerns a method, a magnetic-resonance system, and an electronically readable data carrier that reduce artifacts, in particular artifacts induced by errors in phase encoding, in magnetic resonance technology.

Description of the Prior Art

Magnetic resonance (MR) technology is a known modality with which images of the interior of an examination object are generated. Expressed simply, the examination object is positioned in a magnetic resonance scanner in a strong static, homogeneous basic magnetic field, also called a $B_0$ field, with a field strength of 0.2 tesla to 7 tesla and more, so that nuclear spins in the subject are aligned along the basic magnetic field. To trigger nuclear spin resonance, radio-frequency pulses (RF pulses), for exciting or refocusing the nuclear spins, are radiated into the examination object. The magnetic resonance signals that are thereby triggered are detected and entered into a memory as so-called k-space data, which are used as the basis for the reconstruction of MR images or the determination of spectroscopy data. The scan data are digitized and stored as complex numerical values in a k-space matrix in the memory. An associated MR image is reconstructed from the k-space matrix filled by such values, for example by a multidimensional Fourier transform. For spatial encoding of the scan data, rapidly switched magnetic gradient fields are overlaid on the basic magnetic field.

Due to technical limitations, ambiguities may arise in the gradient system during spatial encoding. This is because, due to the finite length of the gradient coils (in particular in the z-direction), the magnetic field gradient applied during spatial encoding of the signals (for example for slice selection, phase encoding or frequency encoding), is not universally linear, but usually is linear only in a defined scanning region of interest. This scanning region in which the applied magnetic field gradient is linear is also known as a "field of view" (FOV). Outside the FOV, the magnetic field gradient will be "kinked," i.e. the value of the amplitude of the magnetic field gradient G will recede again until it finally disappears completely. This is depicted in FIG. 1 where the dashed line shows the ideal course of the magnetic field gradient G in one spatial direction (for example in the x-, y- or z-direction) and the solid line represents the actual course of the magnetic field gradient G, which only extends linearly in the region of the FOV and has returned to zero at the points N1 and N2.

Normally, only the spatial region of the FOV is of interest for the magnetic resonance scan, particularly in imaging, but additional signals from outside this FOV region are also recorded during the scan and, due to the no longer unambiguous association of an amplitude of the magnetic field gradient G with a location along the spatial direction (x, y, z), these signals are then incorrectly spatially encoded. A case of this kind is depicted with reference to points P1 and P2. Although points P1 and P2 are positioned at different locations along the direction (x, y, or z), the magnetic field gradient G has the same amplitude at each of points P1 and P2 and hence identical encoding is performed. This means signals from these two locations P1 and P2 are both recorded as being present at the location of point P1 and so these signals can no longer be spatially separated.

Such ambiguity in spatial encoding can result in image artifacts in the reconstructed image. In the case of TSE (turbo-spin-echo) based sequences, such an effect is also known as a so-called "3rd arm artifact" if, for example, such an ambiguity in the slice selection causes two different slices to be simultaneously excited and/or refocused.

In phase encoding, such ambiguities also result in artifacts that significantly reduce the quality of the reconstructed images and can even result in incorrect diagnosis. These artifacts occur when a parallel acquisition technique, such as iPAT (integrated parallel acquisition technique) is used, since such ambiguities normally result in high intensities in signals from the marginal regions of the FOV. iPAT techniques often cause these very-high intensity regions then, to be at least partially incorporated in a disruptive manner in the central regions of the FOV. Parallel acquisition techniques enable either higher speed with the same image resolution, or higher resolution with the same scan time, and are therefore attractive, in principle. A shortened scan time is particularly valuable in the case of time-critical evaluations (for example with real-time cardiac imaging, contrast-enhanced angiography or perfusion measurements).

To date, it has been possible to at least reduce these artifacts by recording the scan data several times with different reference lines. However, this does not completely resolve the problem and increases the scan time, which is undesirable.

SUMMARY OF THE INVENTION

The invention therefore, is to enable the above-described artifacts induced by ambiguities in spatial encoding to be avoided, in particular without increasing the scan time required to obtain the data.

This object is achieved by a method according to the invention for avoiding artifacts in scan data recorded by means of a spin-echo sequence that has steps of operating an MR scanner to radiate an excitation pulse, radiate at least one refocusing pulse, read out at least one echo signal, and following the radiation of the excitation pulse and before reading out the at least one echo signal, activating at least two artifact-avoidance gradients with different amplitudes, wherein the moments of the artifact-avoidance gradients balance each other (produce a net zero moment).

The method according to the invention permits the separation of otherwise ambiguous encodings by activating at least two differently polarized artifact-avoidance gradients with different amplitudes in the direction in which the encoding is otherwise not unambiguous. Activation of such artifact-avoidance gradients can be integrated in the conventional course of the pulse sequence without influencing the temporal sequences. Artifacts resulting from an ambiguity that would be present without these additional gradients can be suppressed, or at least significantly reduced, with the artifact-avoidance gradients according to the invention. In this case, the artifact-avoidance gradients can be activated without changing the temporal course of the scan. Hence, the image quality is increased with having to prolong the scan time.

The invention is based on the insight that the course of the field gradient outside the region of the FOV is heavily dependent upon the amplitude. This is also shown in FIG. 2 in which the course of different field gradients with different amplitudes is plotted with different line styles. For purposes of simplicity, FIG. 2 shows only the course of the field gradients G in the positive direction x, y, z. As can be seen, in the region outside the FOV, reversal points as well as the respective exact values of the field gradients G shown in different line styles are different at different amplitudes (i.e. different inclinations in the region of the FOV). This means the moments of the artifact-avoidance gradients balance each other only within the region of the FOV, i.e. they add to zero only there. Outside the region of the FOV, however, despite the compensation of the moments, they still contribute to the signal due to the different amplitude values. As a result, signal components outside the region of the FOV are dephased, but are not rephased again, and hence no longer contribute to the image.

A magnetic-resonance apparatus according to the invention has an MR data acquisition scanner with a basic field magnet, a gradient coil arrangement, a radio-frequency antenna arrangement, and a control computer designed to carry out the method according to the invention.

The present invention also encompasses a non-transitory, computer-readable data storage medium encoded with programming instructions, the storage medium being loaded into a control computer of a magnetic resonance apparatus, and the programming instructions, when executed by the control computer, causing the control computer to operate the magnetic resonance apparatus in order to implement any or all of the embodiments of the inventive method, as described above.

The above advantages and statements with respect to the inventive method also apply to the magnetic-resonance apparatus, and the electronically readable data carrier (storage medium).

DESCRIPTION OF THE PREFERRED EMBODIMENTS

Figure 3:
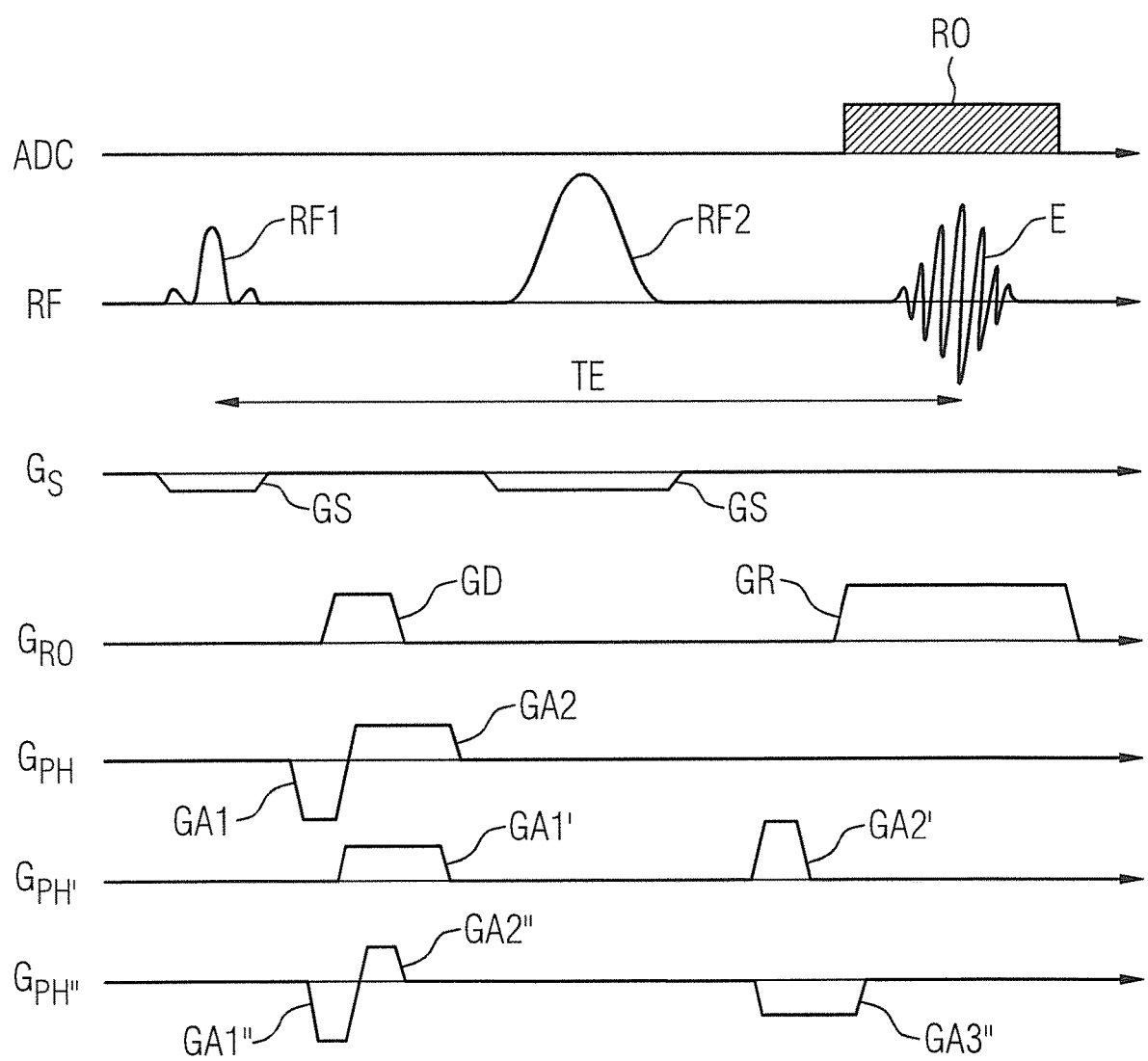
FIG. 3 shows examples of pulse-sequence diagrams with artifact-avoidance gradients.

FIG. 3 shows a schematic pulse-sequence diagram of a spin-echo sequence. Here, the first line depicts the readout action ADC in which the signals triggered by the radio-frequency pulses RF of the pulse sequence are measured (RO).

The second line depicts radio-frequency pulses RF, here as the example an excitation pulse RF1 and a refocusing pulse RF2, such as those used in a spin-echo sequence to excite a signal and refocus it at an echo time back to an echo signal E. Accordingly, the method includes radiation of at least one refocusing pulse RF2 following radiation of the excitation pulse RF1 and before the readout RO of at least one echo signal E.

For clarity, the selected example shows only one refocusing pulse RF2 and one echo signal E. The statements made herein apply analogously to sequences that are known that have multiple refocusing pulses RF2 and echo signals E, for example TSE sequences.

The third line depicts an exemplary course of a slice-selection gradient $G_S$. During switching of slice-selection gradients GS during excitation by the excitation pulse RF1 and during the refocusing with the aid of the refocusing pulse RF2, it is possible to restrict the excitation and refocusing to a specific slice.

The fourth line depicts an exemplary course of a readout gradient $G_{RO}$. In the readout-gradient direction, during the readout (measurement) of the echo signal E, it is possible for a readout gradient GR to be activated in order to impress frequency encoding on the measured signals. It is also possible for a dephasing gradient GD to be activated in order to balance unwanted dephasing of the spins by the readout gradient GR. In the example depicted, the dephasing gradient GD occurs before the refocusing pulse RF2 and therefore has the same polarity as the readout gradient GR.

The following fifth-seventh lines depict different examples of phase-encoding gradients $G_{PH}$, $G_{PH'}$ and $G_{PH''}$ each with artifact-avoidance gradients GA1, GA2, GA1', GA2', GA1" and GA2" according to the invention.

The examples shown should not be considered to be definitive but only show a selection of possible artifact-avoidance gradients according to the invention. However, the artifact-avoidance gradients always occur between an excitation pulse RF1 and a readout process RO following the excitation pulse RF1. As already stated, the artifact-avoidance gradients are embodied such that the zeroed of moments of the switched artifact-avoidance gradients add up to zero and have different amplitudes. For clarity, only examples with artifact-avoidance gradients in the phase-encoding direction $G_{PH}$, $G_{PH'}$ and $G_{PH''}$ are depicted. However, it is also possible for artifact-avoidance gradients to be switched analogously in other encoding directions.

The fifth line shown an example in which two artifact-avoidance gradients GA1 and GA2 are switched between the excitation pulse RF1 and the at least one refocusing pulse RF2.

As described above, the use of such artifact-avoidance gradients that form a bipolar double gradient with different amplitudes and whose zeroed moments balance each other, enables unwanted signal components from outside the technically operative region of the gradient systems, the FOV, to be suppressed or at least significantly reduced.

The radiation of the artifact-avoidance gradients between the excitation pulse RF1 and a refocusing pulse RF2 has the advantage that the course of the sequence does not change after the refocusing pulse RF2. This is advantageous when a number of refocusing pulses RF2 are radiated since, in this case, further adaptations, in particular in the readout region, would otherwise be necessary and this can greatly complicate the gradient switching, particularly in the case of Fast DIXON techniques, which already have bipolar readout gradients. It can also be advantageous to switch the artifact-avoidance gradients between the excitation pulse RF1 and refocusing pulse RF2 when it is already necessary to activate additional gradients, for example for flow compensation, and therefore less space is available for the positioning of artifact-avoidance gradients after a refocusing pulse RF2.

The sixth and seventh line lines depict further examples of artifact-avoidance gradients (once again in the phase-encoding direction $G_{PH'}$, $G_{PH''}$) of which at least one artifact-avoidance gradient GA1', GA1", GA2" is activated before the at least one refocusing pulse RF2 and at least one artifact-avoidance gradient GA2', GA3" is switched after the at least one refocusing pulse RF2. In the example in line six, the artifact-avoidance gradients GA1' and GA2' have the same polarity in order to enable compensation of the respective zeroed moments since the refocusing pulse RF2 reverses the phase sequence of the spins. For the same reason, it is also necessary in the example in line seven for the artifact-avoidance gradient GA3" to have the same polarity sign as the total of the artifact-avoidance gradients GA1" and GA2". Such a division offers more freedom with respect to the incorporation of the artifact-avoidance gradients GA1'; GA2'; GA1"; GA2"; GA3" in the prespecified spin-echo sequence. When the sequence course between the excitation pulse RF1 and the refocusing pulse RF2 is already subject to temporal limitations and/or the region between the excitation pulse RF1 and the refocusing pulse RF2 is already utilized for other purposes, it is advantageous still to be able to arrange artifact-avoidance gradients GA2', GA3" after the refocusing pulse RF2. For example, if a particularly short echo time is desired, a larger temporal region can be planned in the sequential course for artifact-avoidance gradients GA2', GA3" after the refocusing pulse RF2.

It is already sufficient for only two artifact-avoidance gradients GA1, GA2, GA1', GA2' to be activated, with zeroed moments balancing each other. Such activation of artifact-avoidance gradients with a minimum number thereof reduces the number of switchings required and hence relieves the load on the gradient system. Moreover, it is easier to implement the sequence if only a low number of gradients have to be switched.

Figure 1:
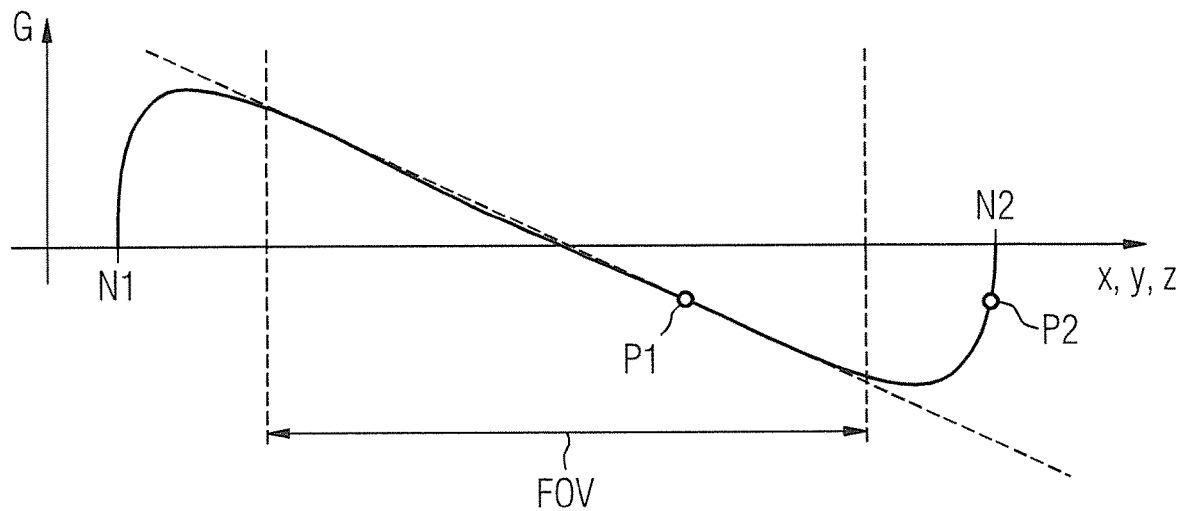
FIG. 1 is a schematic depiction of a typical course of a field gradients in one encoding direction.
Figure 2:
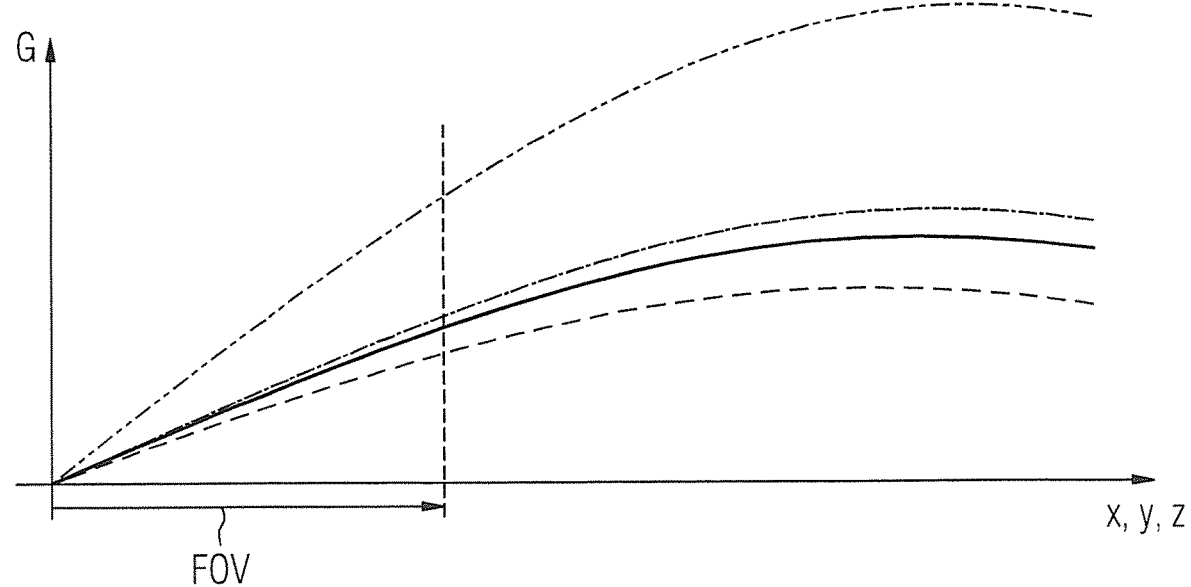
FIG. 2 is an exemplary depiction of the influence of the amplitude on the course of the field gradients outside the region of the FOV.

When choosing the artifact-avoidance gradients GA1, GA2, GA1', GA2'; GA1"; GA2"; GA3", it is recommended that the amplitudes of the artifact-avoidance gradients GA1 and GA2 or GA1' and GA2' or GA1" and GA2" and GA3", activated after an excitation pulse RF1 and before a readout process RO following the excitation pulse RF1, are selected as differently as possible. As described above with reference to FIG. 2, the separation of otherwise ambiguous signals is particularly noticeable. In this case, here, the actual amplitudes can be selected in dependence on the temporal ratios (how much "space" is there in the sequence for additional gradients?) and taking account of hardware constraints (maximum slew rates and amplitudes) or optionally also taking account of SAR limit values (SAR: specific absorption rate) and obviously taking account of the condition that the moments of the artifact-avoidance gradients have to balance each other.

Figure 4:
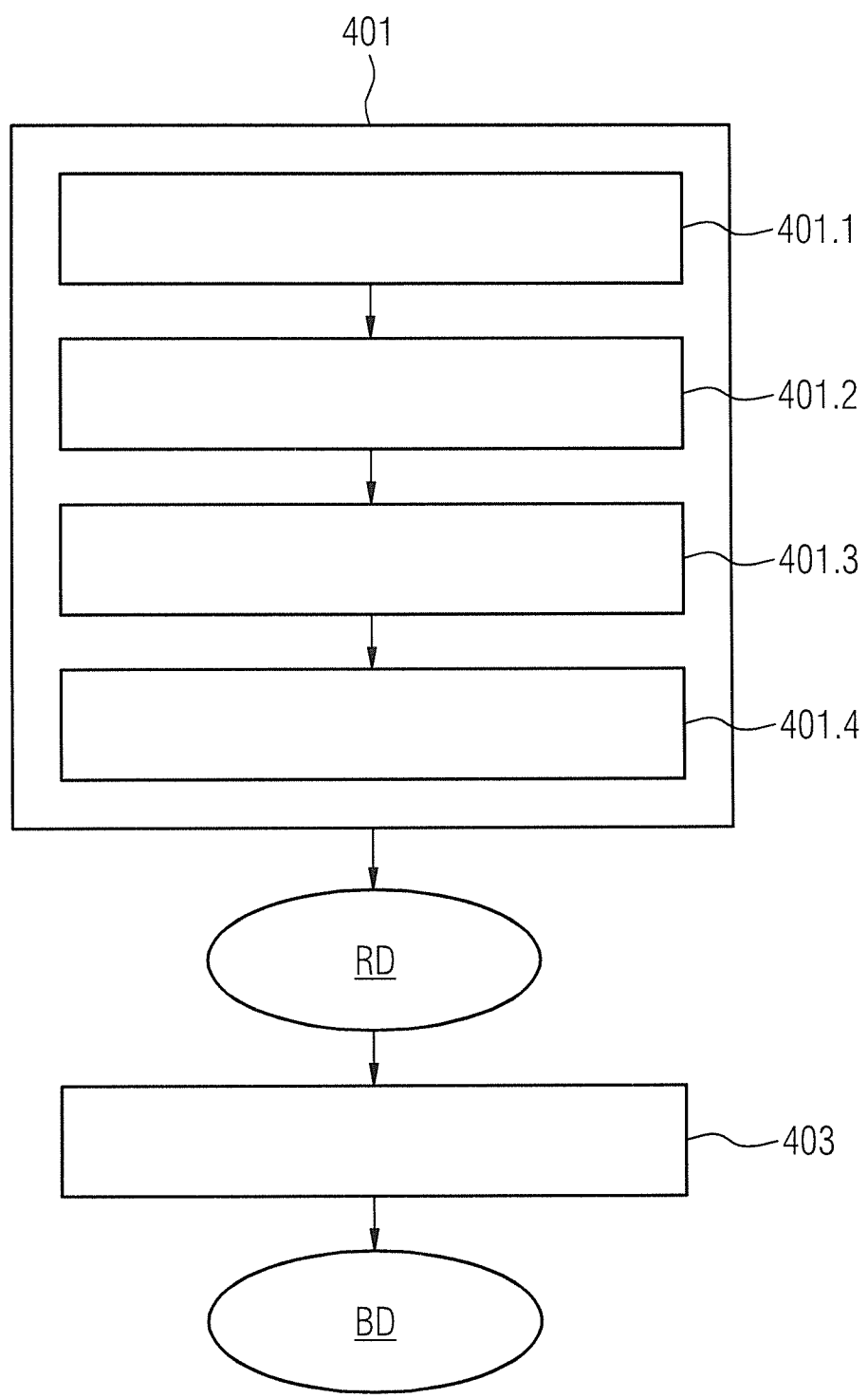
FIG. 4 is a sequence diagram of the method according to the invention.

FIG. 4 is a schematic sequence diagram of the method according to the invention. Here, scan data RD is recorded with the aid of a spin-echo technique 401 with which, in each repetition time TR, an excitation pulse is radiated (Block 401.1.), at least one refocusing pulse is radiated (Block 401.2) and, after the radiation of the excitation pulse and before a subsequent readout of the echo signals generated (Block 401.4), at least two differently polarized artifact-avoidance gradients with different amplitudes the moments of which balance each other out are activated (Block 401.3).

The read-out echo signals are stored as scan data RD and are reconstructed in a further step 403 into image data BD.

Figure 5:
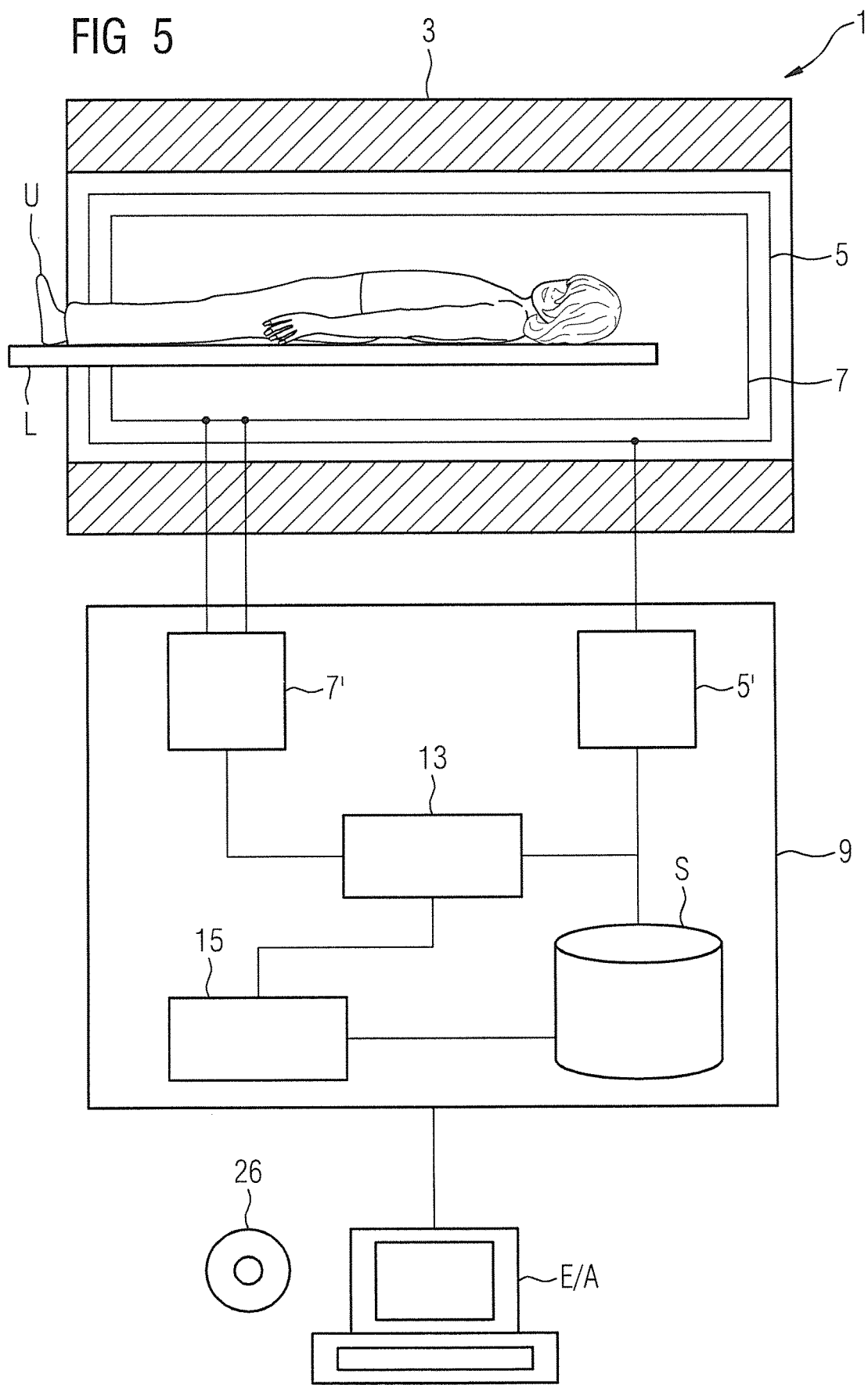
FIG. 5 schematically illustrates a magnetic resonance apparatus according to the invention.

FIG. 5 is a schematic depiction of a magnetic-resonance system according to the invention 1. This has a scanner with a magnet unit 3 that generates the basic magnetic field, a gradient coil arrangement 5 for generating the gradient fields, a radio-frequency antenna arrangement 7 for radiation and receiving radio-frequency signals, and a control computer 9 designed to carry out the method according to the invention. In FIG. 5, these subunits of the magnetic-resonance system 1 are shown only as a schematic depiction. For example, the radio-frequency antenna arrangement 7 can have multiple coils, which can be embodied either only to transmit radio-frequency signals, or only to transmit the radio-frequency signals triggered, or to do both.

For the examination of an examination object U, for example a patient or a phantom, the object can be introduced into the scan volume of the scanner of the magnetic-resonance system 1 on a bed L.

The control computer 9 is configured to control the magnetic-resonance system and can control the gradient arrangement 5 with a gradient controller 5' and the radio-frequency antenna arrangement 7 by of a radio-frequency-transceiver controller 7'. In this case, the radio-frequency antenna arrangement 7 can have a number of channels in which signals can be sent or received.

Together with the radio-frequency-transceiver controller 7', the radio-frequency antenna arrangement 7 is responsible for generating and irradiating (transmitting) a radio-frequency alternating field for the manipulation of the spins in the examination object U. In this case, the mid-frequency of the radio-frequency alternating field, which is also called the B1 field, must be close to the resonance frequency of the spins to be manipulated. For the generation of the B1 field, in the radio-frequency antenna arrangement 7, currents controlled by the radio-frequency transceiver controller 7' are applied to the RF coils.

The control computer 9 furthermore has an artifact-avoidance unit 15 that is configured to carry out a method according to the invention for avoiding artifacts induced by ambiguities in spatial encoding, in particular for the determination of the respective temporal length and the respective amplitude and the respective positioning of the artifact-avoidance gradients to be radiated in a spin-echo sequence. A processor 13 of the control computer 9 is configured to carry out all the computing operations required for the necessary measurements and determinations. Interim results and results required for this or determined hereby can be stored in a memory S of the control computer 9. Here, the units depicted should not necessarily be understood to be physically separate units—instead they only represent a subdivision into symbolic units, which can be implemented, for example, in fewer units or even in only a single physical unit.

A user can use an input/output facility E/A of the magnetic-resonance system 1 to send control commands to the magnetic-resonance system and/or to display results of the control computer 9 such as, for example, also image data or also the specific dephasing factors.

The method as described hereby can also be present in the form of a stored program code that implements the respective method on the control computer 9 when the program code is executed by the control computer 9. An electronically readable data storage medium 26 is encoded with electronically readable control information, which is designed to carry out the method or methods described herein when the data carrier 26 is used in the control computer 9 of the magnetic-resonance system 1.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for avoiding artifacts in the magnetic resonance (MR) scan data, said method comprising:
   operating an MR data acquisition scanner to execute a spin-echo data acquisition sequence and, in said spin-echo data acquisition sequence, radiating an excitation pulse;

operating said MR data acquisition scanner in said spin-echo sequence to radiate at least one refocusing pulse;

operating said MR data acquisition scanner in said spin-echo sequence to read out MR scan data during at least one echo;

operating said MR data acquisition scanner in said spin-echo sequence to activate at least two artifact-avoidance gradients in the same direction following radiation of said excitation pulse and before readout of said MR data during said at least one echo, the at least two artifact avoidance gradients having (i) different amplitudes, and (ii) different respective moments that balance one other; and making the acquired MR scan data available as an electronic signal for further processing, as a datafile.

2. A method as claimed in claim 1 comprising operating said MR data acquisition scanner to activate the artifact-avoidance gradients between the excitation pulse and the at least one refocusing pulse.

3. A method as claimed in claim 1 comprising operating the MR data acquisition scanner to activate at least one artifact-avoidance gradient before the at least one refocusing pulse, and to activate at least one other artifact-avoidance gradient after said at least one refocusing pulse.

4. A method as claimed in claim 1 comprising operating the MR data acquisition scanner to activate exactly one artifact-avoidance gradient with a positive polarity and to activate exactly one other artifact-avoidance gradient with a negative polarity.

5. A method as claimed in claim 1 comprising operating said MR data acquisition scanner to activate said artifact-avoidance gradients in a phase-coding direction.

6. A method as claimed in claim 1 comprising operating said MR data acquisition scanner to activate said artifact-avoidance gradients with respective amplitudes that are as different as possible.

7. A method as claimed in claim 1 comprising operating said MR data acquisition scanner to read out said MR data from said echoes with a parallel acquisition technique.

8. A magnetic resonance (MR) apparatus comprising:
a an MR data acquisition scanner comprising a radio-frequency (RF) antenna arrangement and a gradient coil arrangement;
a control computer configured to operate said MR data acquisition scanner to execute a spin-echo data acquisition sequence and, in said spin-echo data acquisition sequence, radiating an excitation pulse;
said control computer being configured to operate said MR data acquisition scanner in said spin-echo sequence to radiate at least one refocusing pulse from said RF antenna arrangement;
said control computer being configured to operate said MR data acquisition scanner in said spin-echo sequence to read out MR scan data during at least one echo;
said control computer being configured to operate said MR data acquisition scanner in said spin-echo sequence to activate at least two artifact-avoidance gradients with said gradient coil arrangement in the same direction following radiation of said excitation pulse and before readout of said MR data during said at least one echo, the at least two artifact avoidance gradients having (i) different amplitudes, and (ii) different respective moments that balance one other; and said control computer being configured to make the acquired MR scan data available as an electronic signal for further processing, as a datafile.

9. A non-transitory, computer-readable data storage medium encoded with programming instructions, said storage medium being loaded into a control computer of a magnetic resonance (MR) apparatus comprising an MR data acquisition scanner, said programming instructions causing said control computer to:

operate said MR data acquisition scanner to execute a spin-echo data acquisition sequence and, in said spin-echo data acquisition sequence, radiating an excitation pulse;

operate said MR data acquisition scanner in said spin-echo sequence to radiate at least one refocusing pulse;

operate said MR data acquisition scanner in said spin-echo sequence to read out MR scan data during at least one echo;

operate said MR data acquisition scanner in said spin-echo sequence to activate at least two artifact-avoidance gradients in the same direction following radiation of said excitation pulse and before readout of said MR data during said at least one echo, the at least two artifact avoidance gradients having (i) different amplitudes,. and (ii) different respective moments that balance one other; and make the acquired MR scan data available as an electronic signal for further processing, as a datafile.

10. A method as claimed in claim 1, wherein the at least two artifact avoidance gradients balance each other's moment by producing a net zero moment.

11. A method as claimed in claim 1, wherein the MR data acquisition scanner includes a field of view (FOV) in which applied magnetic field gradients are linear, and
wherein the at least two artifact avoidance gradients have different amplitudes as a result of different inclinations within a region of the FOV.

12. A method as claimed in claim 1, wherein the MR data acquisition scanner includes a field of view (FOV) in which applied magnetic field gradients are linear, and
wherein the moments of the at least two artifact avoidance gradients balance each other only within a region of the FOV.

* * * * *